US006566950B1

(12) United States Patent
Rokhsaz

(10) Patent No.: US 6,566,950 B1
(45) Date of Patent: May 20, 2003

(54) DIFFERENTIAL LINE DRIVER THAT INCLUDES AN AMPLIFICATION STAGE

(75) Inventor: Shahriar Rokhsaz, Austin, TX (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 10/046,214

(22) Filed: Oct. 29, 2001

Related U.S. Application Data

(62) Division of application No. 09/823,335, filed on Mar. 30, 2001.

(51) Int. Cl.[7] ................................................ H03F 3/45
(52) U.S. Cl. ....................................... 330/253; 330/261
(58) Field of Search ................................ 330/253, 261, 330/252

(56) References Cited

U.S. PATENT DOCUMENTS

| | | | |
|---|---|---|---|
| 3,395,358 A | 7/1968 | Petersen | |
| 3,440,554 A | 4/1969 | McGraw | |
| 5,596,610 A | * 1/1997 | Leung et al. | 375/376 |
| 5,936,896 A | 8/1999 | Cho et al. | |
| 6,005,438 A | * 12/1999 | Shing | 330/253 |
| 6,028,479 A | 2/2000 | Babanezhad | |
| 6,087,899 A | 7/2000 | Kubota | |
| 6,304,141 B1 | * 10/2001 | Kennedy et al. | 330/253 |

* cited by examiner

*Primary Examiner*—Henry Choe
(74) *Attorney, Agent, or Firm*—H. C. Chan; Justin Liu

(57) ABSTRACT

A high-speed, low distortion line driver that includes an amplifying circuit and a differential input amplifier. The differential input amplifier includes a $1^{st}$ amplifying transistor, a $2^{nd}$ amplifying transistor, a $1^{st}$ controlled current source, and a $2^{nd}$ controlled current source. The $1^{st}$ amplifying transistor is coupled in series with the $1^{st}$ controlled current source and the $2^{nd}$ amplifying transistor is coupled in series with the $2^{nd}$ controlled current source. The $1^{st}$ and $2^{nd}$ amplifying transistors are operably coupled to receive a differential input signal and provide a gained and level shifted representation of the differential input signal based on the controlled currents provided by the $1^{st}$ and $2^{nd}$ current sources. The amount of gain is based on the transconductance properties of the $1^{st}$ and $2^{nd}$ amplifying transistors and of the $1^{st}$ and $2^{nd}$ current sources.

8 Claims, 6 Drawing Sheets

DIFFERENTIAL LINE DRIVER THAT INCLUDES AN AMPLIFICATION STAGE

TECHNICAL FIELD OF THE INVENTION

This invention relates generally to telecommunications and more particularly to line drivers that are used in telecommunication equipment.

BACKGROUND OF THE INVENTION

As is known, communication systems include a plurality of users (e.g., telephones, personal computers, facsimile machines, web information resources, et cetera) that communicate data (e.g., audio, voice, video, text, and/or multimedia) via a communication network. The communication network, which may be a public switch telephone network (PSTN), the Internet, local area network (LAN), wide area network (WAN), et cetera, includes a plurality of network switches. To facilitate the conveyance of data, the communication network employs one or more standardized data transmission protocols, such as asynchronous transfer mode (ATM), asymmetrical digital subscriber line (ADSL), integrated services digital network (ISDN), et cetera.

Regardless of the data transmission protocol, the transmission of data between user and network switch, network switch and network switch, and network switch and user is via a wireless, wireline, and/or fiber optic transmission line. As is known, high frequency components of signals that are transmitted over a wireless transmission are adversely effect by the frequency response characteristics of the wireline transmission line. To reduce the adverse effects, each of the data transmission protocols includes techniques to recover the high frequency components of the transmitted data and requires the use of line drivers.

As is known, line drivers receive a low power input signal and increase its power such that the signal can drive a wireline transmission line. In essence, the line drivers are power amplifiers that accurately reproduce the input signal (i.e., with negligible distortion) and may include conventional architectures, such as Class A amplifier, Class B amplifier, Class AB amplifier, etc. While conventional line drivers work well for many applications, they become less and less effective as the supply voltage decreases and the data rates increase. For example, at a 1.6 volt supply voltage and data rates in excess of 200 Mbps (megabits per second), conventional line drivers introduce non-negligible distortion to the signal, making them unacceptable for such applications. The distortion is introduced by the parasitic properties of the components used to implement the line driver.

In addition to the above issues for conventional line drivers, they typically require a gain stage to amplify the magnitude of an incoming signal before an acceptable drive signal can be produced when operated at low voltages. Gain stages are typically implemented using an operational amplifier and resistors interoperably coupled to produce the desired gain. For high-speed data rates (e.g., in excess of 200 Mbps), the parasitic properties of the operational amplifier distort the high-speed data, rendering conventional gain stages an impractical pre-amplifier for high-speed line drivers. Alternatively, a switched capacitor circuit may provide the gain stage, but for high-speed data rates, the switched capacitor circuit would require a very fast and accurate clock. While such a clock may be implemented with today's technology, it adds additional cost to the line driver. When one considers that hundreds of millions of line drivers are fabricated each year for various types of telecommunication equipment, even a fraction of a penny of additional cost due to a very fast and accurate clock adds up to millions of dollars per year. Another drawback of switched capacitor circuits is that they introduce noise into the substrate, thereby adversely affecting other circuits on the substrate.

Therefore, a need exists for a high-speed line driver that includes gain, introduces negligible distortion, has good resolution, adjustable output impedance to match the line impedance, and can be economically fabricated.

DETAILED DESCRIPTION OF A PREFERRED EMBODIMENT

Generally, the present invention provides a high-speed, low distortion line driver that includes an amplifying circuit and a differential input amplifier. The differential input amplifier includes a $1^{st}$ amplifying transistor, a $2^{nd}$ amplifying transistor, a $1^{st}$ controlled current source, and a $2^{nd}$ controlled current source. The $1^{st}$ amplifying transistor is coupled in series with the $1^{st}$ controlled current source and the $2^{nd}$ amplifying transistor is coupled in series with the $2^{nd}$ controlled current source. The $1^{st}$ and $2^{nd}$ amplifying transistors are operably coupled to receive a differential input signal and provide a gained and level shifted representation of the differential input signal based on the controlled currents provided by the $1^{st}$ and $2^{nd}$ current sources. The amount of gain is based on the transconductance properties of the $1^{st}$ and $2^{nd}$ amplifying transistors and of the $1^{st}$ and $2^{nd}$ current sources. With such a high-speed, low distortion line driver, a 100-Ohm load, or any other specified load, may readily be driven for a low voltage source (e.g., 1.6 volts) with linearity of at least 6 bits of resolution. In addition, the line driver has a high input impedance, thus it is of minimal loading to the circuitry sourcing the incoming signal.

Figure 1:
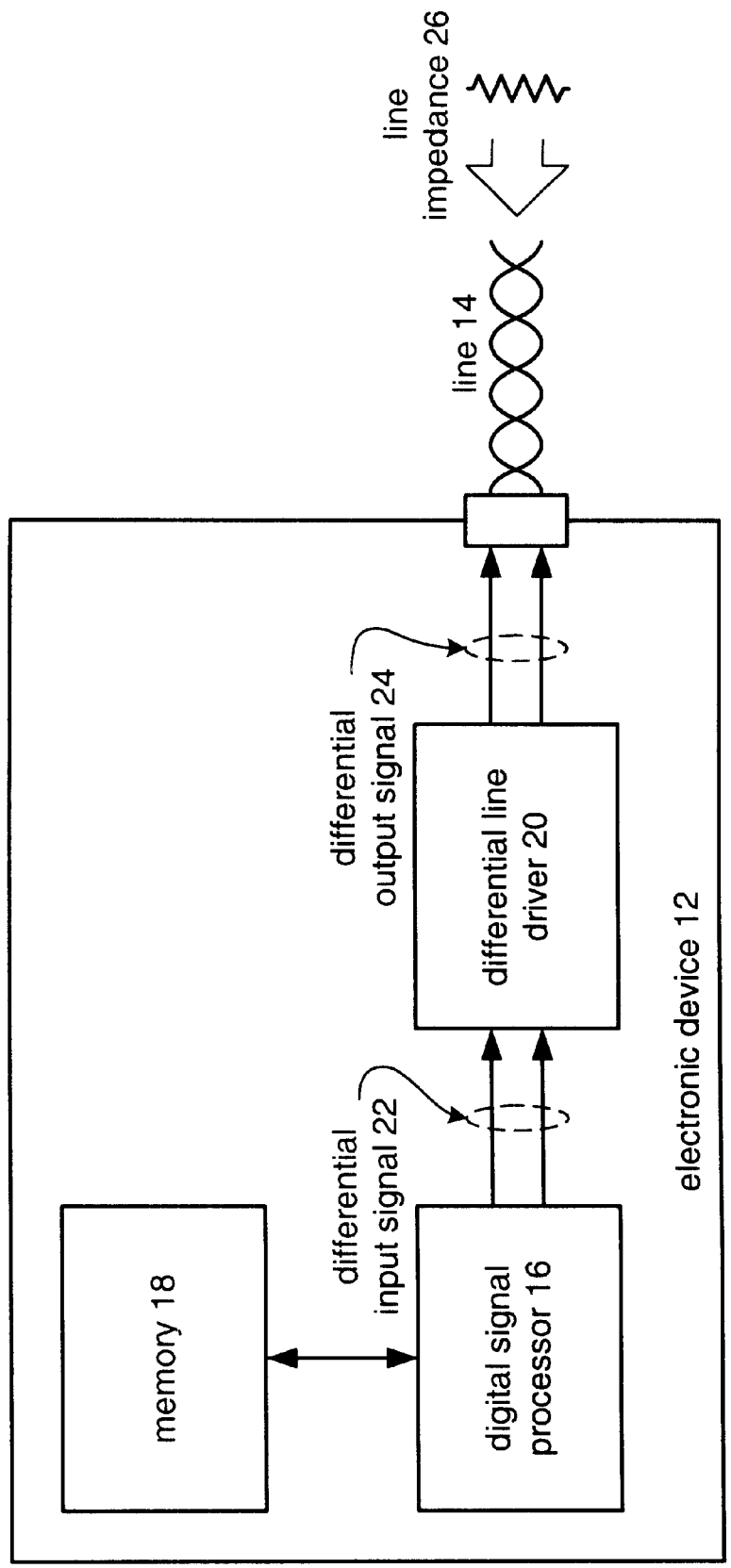
FIG. 1 illustrates a schematic block diagram of an electronic device in accordance with the present invention.

The present invention can be more fully described with reference to FIGS. 1 through 9. FIG. 1 illustrates a schematic block diagram of an electronic device 12 operably coupled to a line 14. The line 14 may be a twisted copper telephone wire, coaxial cable, standard copper and/or gold wires, and/or any other means for transporting electronic signals. The line 14 includes a reflected line impedance 26, which depending on the application, may be 100 Ohms.

The electronic device 12 includes a digital signal processor 16, memory 18, and a differential line driver 20. The digital signal processor 16 may be a general-purpose digital signal processor (DSP), a microprocessor, a programmable gate array, state machine, logic circuitry, and/or any device that manipulates signals (analog or digital) based on operational instructions. The memory 18 may be read-only memory, random access memory, and/or any device that stores digital information. In operation, the digital signal processor 16 performs an algorithm stored in memory 18, or retrieved from external memory, on data that may be stored in memory 18, retrieved from the external memory, or received via a digital interface of the electronic device 12. For example, the electronic device 12 may be a modem, network switch, telephone, facsimile machine, personal digital assistance, computer, etc.

As a result of executing an algorithm, the digital signal processor 16 produces a differential input signal 22. The digital signal processor 16 provides the differential input signal 22 to the differential line driver 20, which produces a differential output signal 24. By design, the differential line driver 20 has a high input impedance and a low output impedance, which can be set, or adjusted, to match the line impedance 26. As such, by having a high input impedance, the differential line driver 20 provides minimal loading on the digital signal processor 16. By having a low output impedance, the differential line driver 20 is capable of driving high-speed data on to line 14 with minimal distortion.

As one of average skill in the art will appreciate, the electronic device 12 may be incorporated into a piece of equipment wherein the line 14 couples the electronic device 12 to another electronic device. Accordingly, the impedance of line 14 is dependent upon its length and the speed at which the data is being conveyed between electronic devices. As one of average skill in the art will further appreciate, the electronic device 12 may be incorporated on a printed circuit board along with another electronic device, where the line 14 is representative of traces on the printed circuit board. In this application, the data rate is very high (e.g., in excess of 200 megabits per second) such that the traces on the printed circuit board act as a transmission line.

Figure 2:
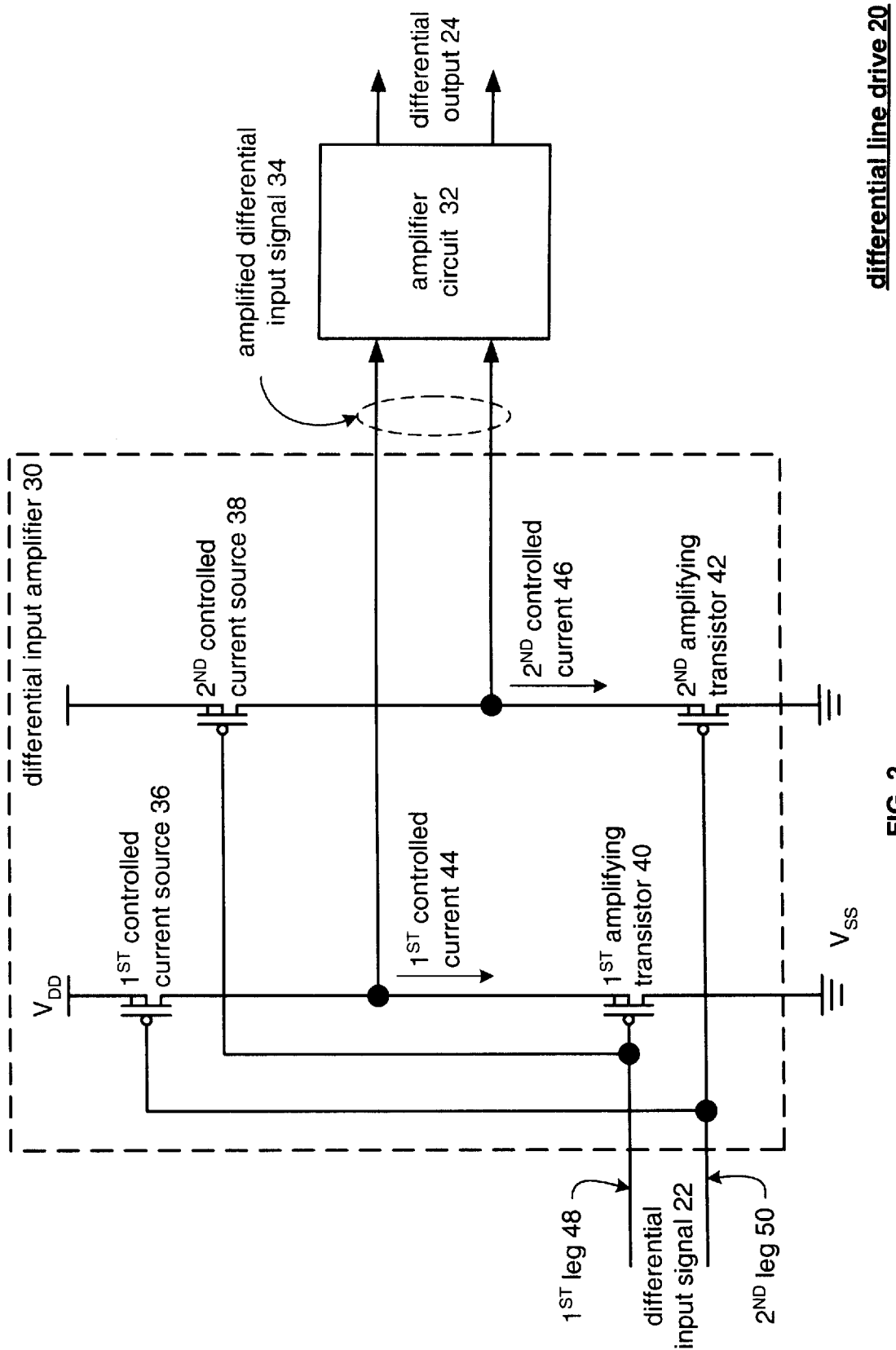
FIG. 2 illustrates a schematic block diagram of a differential line driver in accordance with the present invention.

FIG. 2 illustrates a schematic block diagram of the differential line driver 20, which includes a differential input amplifier 30 and an amplifier circuit 32. The differential input amplifier 30 includes a $1^{st}$ controlled current source 36, a $1^{st}$ amplifying transistor 40, a $2^{nd}$ controlled current source 38 and a $2^{nd}$ amplifying transistor 42. The $1^{st}$ and $2^{nd}$ controlled current sources 36 and 38 may be implemented as P-channel field effect transistors (FETs). In this embodiment, the $1^{st}$ and $2^{nd}$ amplifying transistors 40 and 42 are also implemented utilizing P-channel field effect transistors. Depending on the supply voltage, the desired output swing, and the magnitude of the differential input signal 22, the transistors used to implement the $1^{st}$ and $2^{nd}$ controlled current sources 36 and 38 and the $1^{st}$ and $2^{nd}$ amplifying transistors 40 and 42 may be enhancement mode FETs and/or depletion mode FETS.

The $1^{st}$ and $2^{nd}$ amplifying transistors 40 and 42 are operably coupled to receive a $1^{st}$ leg 48 and a $2^{nd}$ leg 50 of the differential input signal 22, respectively. The gate of the $1^{st}$ controlled current source 36 is operably coupled to the $2^{nd}$ leg 50 of the differential input signal 22. Based on the voltage of the $2^{nd}$ leg 50 of the differential input signal 22 and the characteristics of the $1^{st}$ controlled current source 36, the $1^{st}$ controlled current source 36 produces a $1^{st}$ controlled current 44. The $1^{st}$ amplifying transistor 40 is operably coupled in series with the $1^{st}$ controlled current source 36 such that the $1^{st}$ controlled current 44 flows through the $1^{st}$ amplifying transistor 40. In operation, the $1^{st}$ amplifying transistor 40 and the $1^{st}$ controlled current source 36 remain in the saturation state. In this state, the gain for the differential input amplifier 30 with respect to the $1^{st}$ controlled current source 36 and $1^{st}$ amplifying transistor 40 is based on the transconductance properties of the $1^{st}$ controlled current source 36 and the $1^{st}$ amplifying transistor 40. In this configuration, the gain is:

$$(G_{m36}+G_{m40})/G_{m40}$$

where $G_{m36}$, represents the transconductance of the $1^{st}$ controlled current source 36 and $G_{m40}$ represents the transconductance properties of the $1^{st}$ amplifying transistor 40.

The $2^{nd}$ controlled current source 38 is operably coupled to the $1^{st}$ leg 48 of the differential input signal 22. As coupled, the $2^{nd}$ controlled current source 38 produces a $2^{nd}$ controlled current 46. The $2^{nd}$ amplifying transistor 42, being coupled in series with the $2^{nd}$ controlled current source 38, receives the $2^{nd}$ controlled current 46. The gain of this leg of the differential input amplifier 30 is also based on the transconductance of the $2^{nd}$ controlled current source 38 and of the $2^{nd}$ amplifying transistor 40. In particular, the gain is $(G_{m38}+G_{m42})/G_{m42}$. Accordingly, by sizing the amplifying transistors 40 and 42 and the transistors of the $1^{st}$ and $2^{nd}$ controlled current sources 36 and 38, a gain of two or more may be achieved, which is sufficient for the high-speed differential line driver 20.

In operation, the differential input amplifier 30 receives the differential input signal 22. When the potential on the $1^{st}$ leg 48 is greater than the potential on the $2^{nd}$ leg 50, the $1^{st}$ controlled current source 36 is turned on harder, while the $1^{st}$ amplifying transistor 40 is turned on less. As such, the node between the $1^{st}$ controlled current source 36 and the $1^{st}$ amplifying transistor 40 is actively pulled towards the positive supply potential ($V_{DD}$). With the same input applied, the $2^{nd}$ amplifying transistor 42 is turned on harder, while the $2^{nd}$ controlled current source 38 is turned on less. Thus, the node coupling the $2^{nd}$ controlled current source 38 to the $2^{nd}$ amplifying transistor 42 is pulled towards the negative supply line ($V_{SS}$). The nodes coupling the $1^{st}$ amplifying transistor 40 to the $1^{st}$ current source 36 and the node coupling the $2^{nd}$ amplifying transistor to the $2^{nd}$ current source provide the output of the differential input amplifier, which is labeled amplified differential input signal 34.

When the differential input signal 22 has the $2^{nd}$ leg 50 having a larger potential than the $1^{st}$ leg 48, the node between the $1^{st}$ controlled current source 36 and the $1^{st}$ amplifying transistor 40 is pulled towards the negative supply line ($V_{ss}$). The node coupling the $2^{nd}$ controlled current source 38 to the $2^{nd}$ amplifying transistor 42 is pulled towards the positive supply line ($V_{DD}$). As such, the amplified differential input signal 34 is an amplified representation of the differential input signal 22 wherein the amplification is based on the transconductance properties of the $1^{st}$ and $2^{nd}$ controlled current sources 36 and 38 and of the $1^{st}$ and $2^{nd}$ amplifying transistors 40 and 42.

The amplifier circuit 32 is operably coupled to receive the amplified differential input signal 34 and to produce a differential output 24 therefrom. The amplifying circuit 32 will be discussed in greater detail with reference to FIG. 3.

Figure 3:
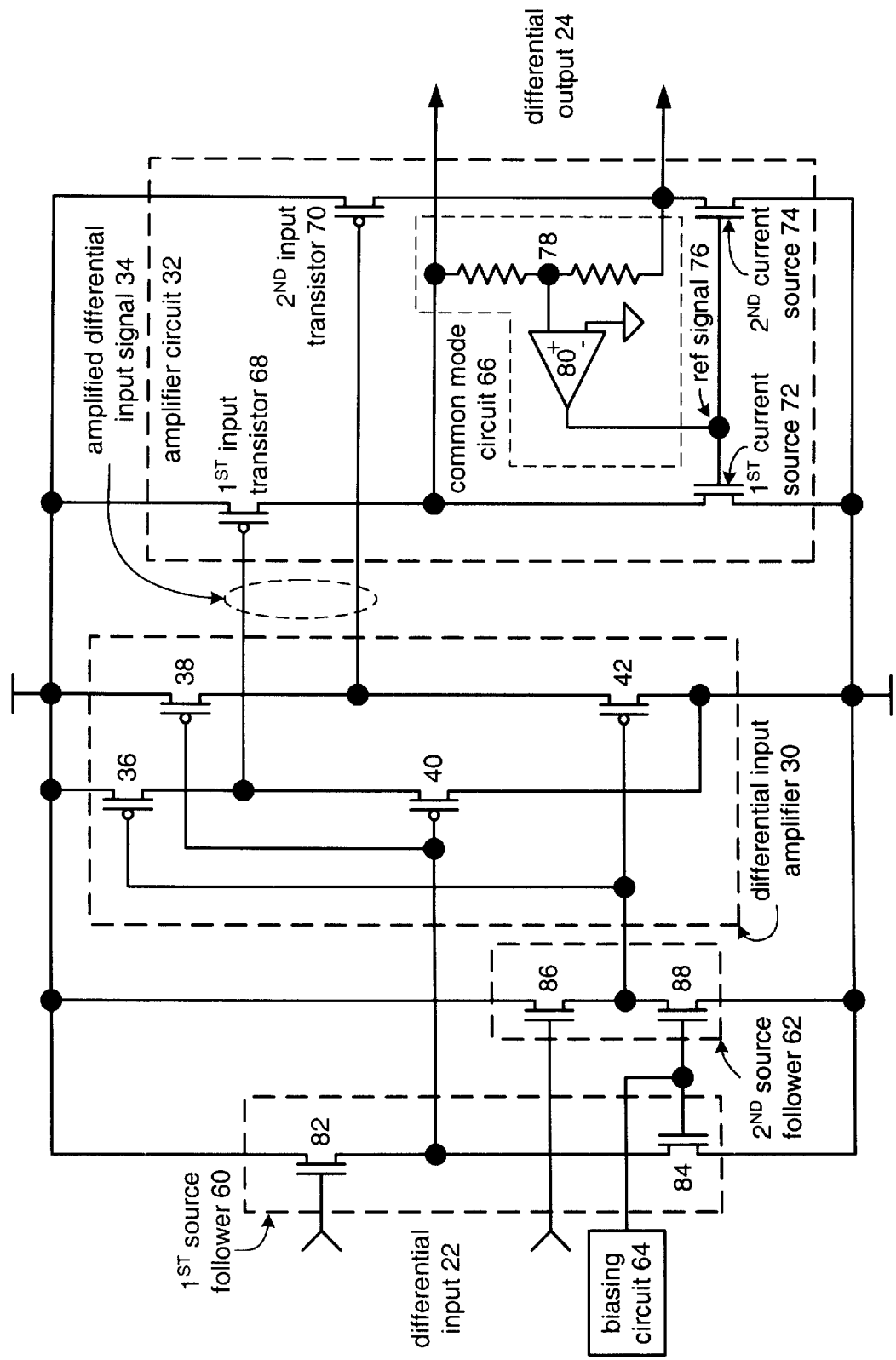
FIG. 3 illustrates a more detailed schematic block diagram of a differential line driver in accordance with the present invention.

FIG. 3 illustrates a more detailed schematic block diagram of the differential line driver 20. In this embodiment, the differential line driver 20 includes a $1^{st}$ source follower 60, a $2^{nd}$ source follower 62, a biasing circuit 64, the differential input amplifier 30, and the amplifying circuit 32. The differential input amplifier 30 includes the $1^{st}$ controlled current source 36, the $2^{nd}$ controlled current source 38, the $1^{st}$ amplifying transistor 40 and the $2^{nd}$ amplifying transistor 42. The operation of the differential input amplifier 30 is as discussed above with reference to FIG. 2.

In this configuration, the $1^{st}$ source follower 60 is operably coupled to receive a $1^{st}$ leg 48 of the differential input 22 while the $2^{nd}$ source follower 62 is operably coupled to receive the $2^{nd}$ leg 50 of the differential input signal 22. The $1^{st}$ source follower 60 includes a $1^{st}$ transistor 82 and a $2^{nd}$ transistor 84 operably coupled in series. AS configured, transistor 82 functions as a source follower such that the $1^{st}$ amplifying transistor 40 receives the $1^{st}$ leg 48 of the differential input amplifier via the $1^{st}$ source follower 60. Similarly, the $2^{nd}$ amplifying transistor 42 receives the $2^{nd}$ leg 50 of the differential input 22 via the $2^{nd}$ source follower 62. The biasing circuit 64 provides a bias voltage to transistors 84 and 88 to establish a bias current for the source followers 60 and 62.

As one of average skill is aware, the threshold voltage ($V_T$) for field effect transistors is greater when the substrate is coupled to a rail voltage (e.g., $V_{DD}$ or $V_{SS}$) than when it is coupled to the source of the transistor. Accordingly, by implementing transistor 82 and 86 with N-channel FETs having the substrate coupled to $V_{DD}$ and the $1^{st}$ and $2^{nd}$ amplifying transistors 40 and 42 with P-channel FETs having the substrate coupled to the source, the input voltage is shifted based on the differences in the threshold voltages. As one of average skill in the art will appreciate, level shifting the differential input 22 allows for a greater input swing. In addition, by cross-coupling the legs 48 and 60 of the differential input 22 to the $1^{st}$ and $2^{nd}$ controlled current sources 36 and 38 enables the line driver 20 to operate at low voltages (e.g., down to 1.6 volts) and have an output swing of 2 volts peak-to-peak. Further, the line driver 20 accurately drives high-speed data (e.g., greater than 200 Mbps) on to transmission line because it is implemented with a minimal number of components, thus minimizing the adverse effects of parasitic properties.

The amplifying circuit 32 includes a $1^{st}$ input transistor 68, a $2^{nd}$ input transistor 70, a $1^{st}$ current source 72, a 2 current source 74 and a common mode circuit 66. The $1^{st}$ and $2^{nd}$ input transistors 68 and 70 are operably coupled to receive the amplified differential input signal 34. The $1^{st}$ and $2^{nd}$ current sources 72 and 74 provide a reference current to the $1^{st}$ and $2^{nd}$ input transistors 68 and 70 based on a reference signal 76, respectively. The common mode circuit 66 produces the reference signal 76 by sensing the differential output 24. As shown, the common mode circuit 66 includes a divider network 78 and a amplifier 80 with one input of the amplifier 80 operably coupled to the divider network 78 and the other input is coupled to an analog reference voltage. The divider network 78 includes resistors operably coupled to the differential output 24 where a tap of the divider network provides the input to the amplifier 80. As one of average skill in the art will appreciate, the resistive divider network may include a variable resistor such that the reference signal 76 may be varied. Note that by varying the resistive divider 78, the output impedance of the line driver 20 may be adjusted to match the line impedance 26. Alternatively, if the divider network 78 includes fixed resistors, the resistive values are selected to match the line impedance 26.

Figure 4:
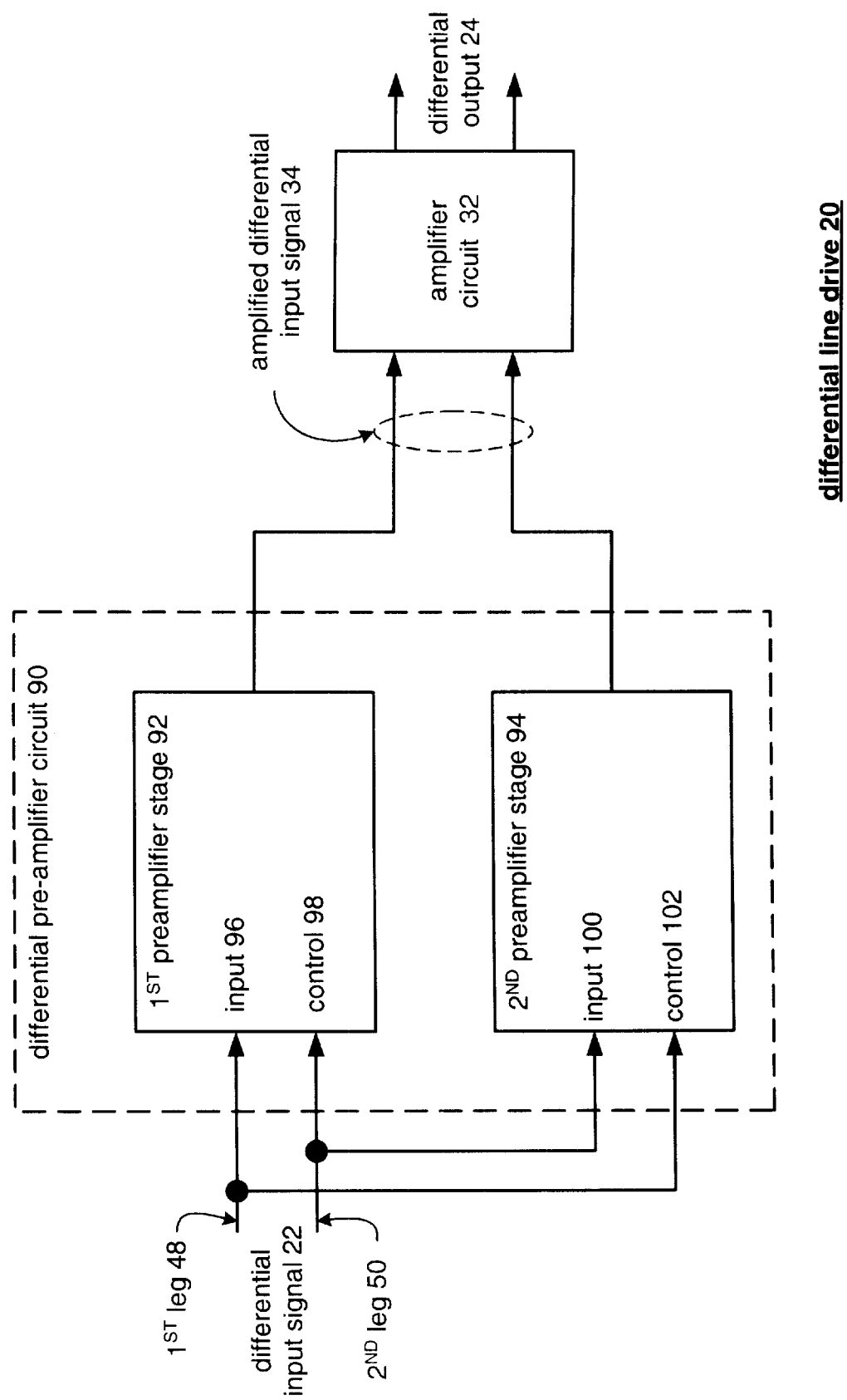
FIG. 4 illustrates a schematic block diagram of an alternate differential line driver in accordance with the present invention.

FIG. 4 illustrates a schematic block diagram of an alternate embodiment for the differential line driver 20. In this embodiment, the differential line driver 20 includes a differential pre-amplifier circuit 90 operably coupled to the amplifier circuit 32. The differential pre-amplifier circuit 90 includes a $1^{st}$ pre-amplifier stage 92 and a $2^{nd}$ pre-amplifier stage 94. The $1^{st}$ and $2^{nd}$ pre-amplifier stages 92 and 94 produce the amplified differential input signal 34.

The $1^{st}$ pre-amplifier stage 92 receives the $1^{st}$ leg 48 of the differential input signal 22 as an input 96. In addition, the $1^{st}$ pre-amplifier stage 92 receives the $2^{nd}$ leg 50 of the differential input signal 22 as a control signal 98. Based on the control signal 98, the $1^{st}$ pre-amplifier stage 92 produces a $1^{st}$ leg of the amplified differential input signal 34 from the $1^{st}$ leg 48 of the differential input signal 22.

The $2^{nd}$ pre-amplifier stage 94 receives the $2^{nd}$ leg 50 of the differential input signal 22 as an input signal 100. In addition, the $2^{nd}$ pre-amplifier stage 94 receives the $1^{st}$ leg 48 of the differential input signal 22 as a control signal 102. Based on the control signal 102, the $2^{nd}$ pre-amplifier stage 94 produces a $2^{nd}$ leg of the amplified differential input signal 34 from the $2^{nd}$ leg 50 of the differential input signal 22.

Figure 5:
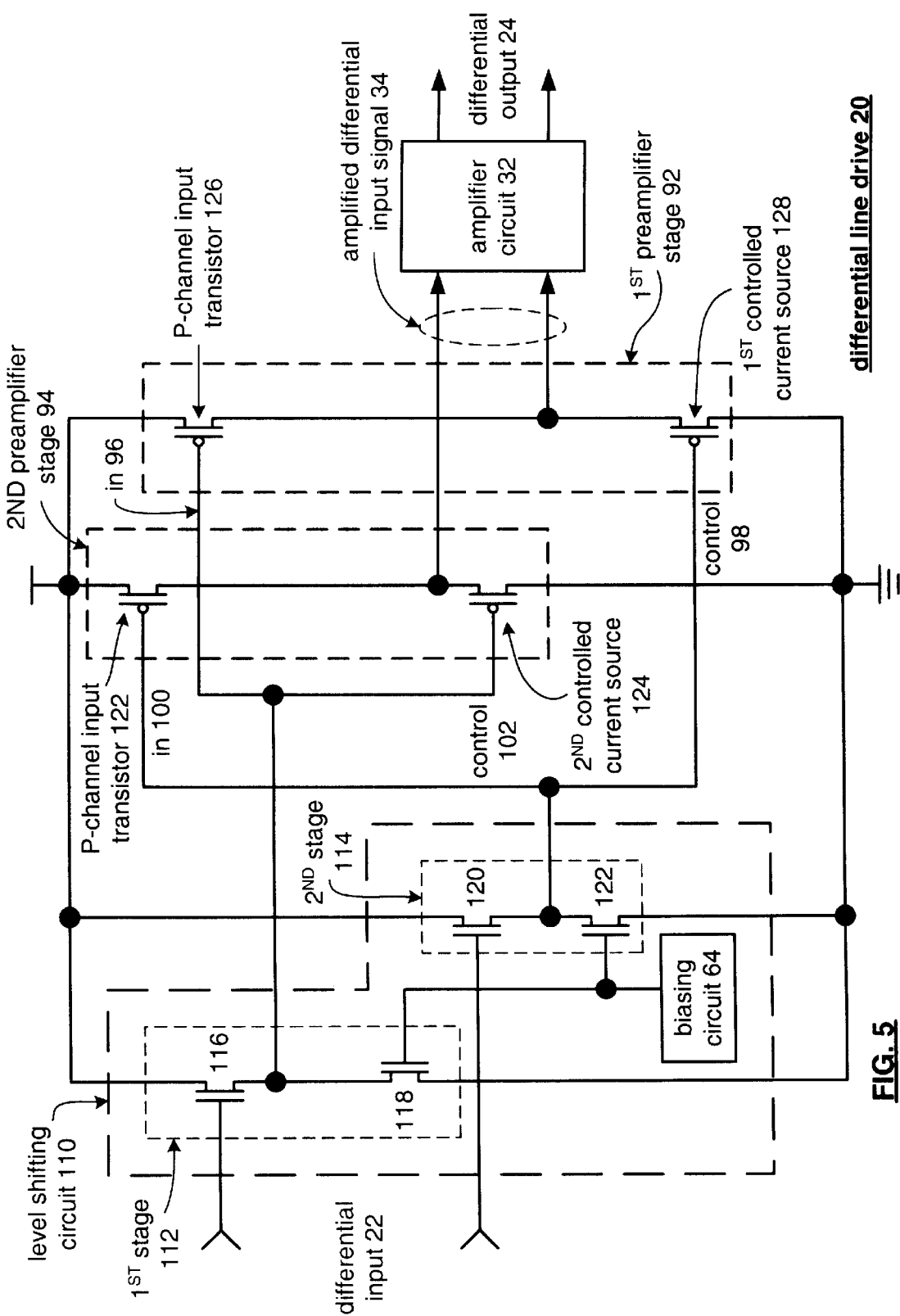
FIG. 5 illustrates a more detailed schematic block diagram of the alternate differential line driver in accordance with the present invention.

FIG. 5 illustrates a schematic block diagram of another embodiment of the differential line driver 20. The differential line driver 20 includes a level shifting circuit 110, the $2^{nd}$ pre-amplifier stage 94, the $1^{st}$ pre-amplifier stage 92, and the amplifier circuit 32. The level shifting circuit 110 includes a $1^{st}$ stage 112, a $2^{nd}$ stage 114, and a biasing circuit 64. The $1^{st}$ stage 112 of the level shifting circuit 110 includes two N-channel transistors 116 and 118 operably coupled in series. Transistor 116 is operably coupled to receive one leg of the differential input signal 22 and transistor 118 provides a reference current to transistor 116 based on a bias signal supplied by the biasing circuit 64. In this configuration, the $1^{st}$ stage 112 provides a source follower with respect to one leg of the differential input signal 22. Similarly, the $2^{nd}$ stage 114, which includes transistor 120 and 122, provides a source follower for the $2^{nd}$ leg of the differential input signal 22.

The $2^{nd}$ pre-amplifier stage 94 includes a P-channel input transistor 122 coupled in series with a $2^{nd}$ controlled current source 124. The $2^{nd}$ controlled current source 124 may be implemented utilizing a P-channel transistor. The gate of the P-channel input transistor 122, which is the input 100 for the $2^{nd}$ preamplifier stage 94, is operably coupled to the output of the $2^{nd}$ stage 114. As such, the P-channel input transistor 122 receives a source followed representation of the $2^{nd}$ leg of the differential input signal 22. The gate of the $2^{nd}$ controlled current source 124, which is the $1^{st}$ control signal 102 for the $2^{nd}$ preamplifier stage 94, is operably coupled to the source followed representation of the $1^{st}$ leg of the differential input signal 22.

The $1^{st}$ pre-amplifier stage 92 includes a P-channel input transistor 126 coupled in series with a $1^{st}$ controlled current source 128. The gate of the P-channel input transistor 126, which is the input for the $1^{st}$ preamplifier stage 92, is operably coupled to receive the source followed representation of the $1^{st}$ leg of the differential input signal 22. The gate of the $1^{st}$ controlled current source 128, which is the control signal 98 for the $1^{st}$ preamplifier stage 92, is operably coupled to receive the source followed representation of the $2^{nd}$ leg of the differential input signal 22. The amplified differential input signal 34 is produced by the series nodes coupling the P-channel input transistor 122 to the $2^{nd}$ controlled current source 124 and the node coupling the P-channel input transistor 126 to the $1^{st}$ controlled current source 128.

In this configuration, the level shifting circuit 110 shifts the differential input signal 22 based on the difference between the threshold voltages of the N-channel transistors 116 and 120 and the threshold voltages of the P-channel input transistors 122 and 126. In addition, the level shifting circuit 110 functions as a source follower for the differential input signal 22. Further, by cross-coupling the inputs 96 and 102 and control signals 98 and 102 of $1^{st}$ and $2^{nd}$ preamplifier stages 92 and 94, provides amplification of the differential input signal 22 based on the transconductance properties of transistors 122, 124, 126 and 128.

Figure 6:
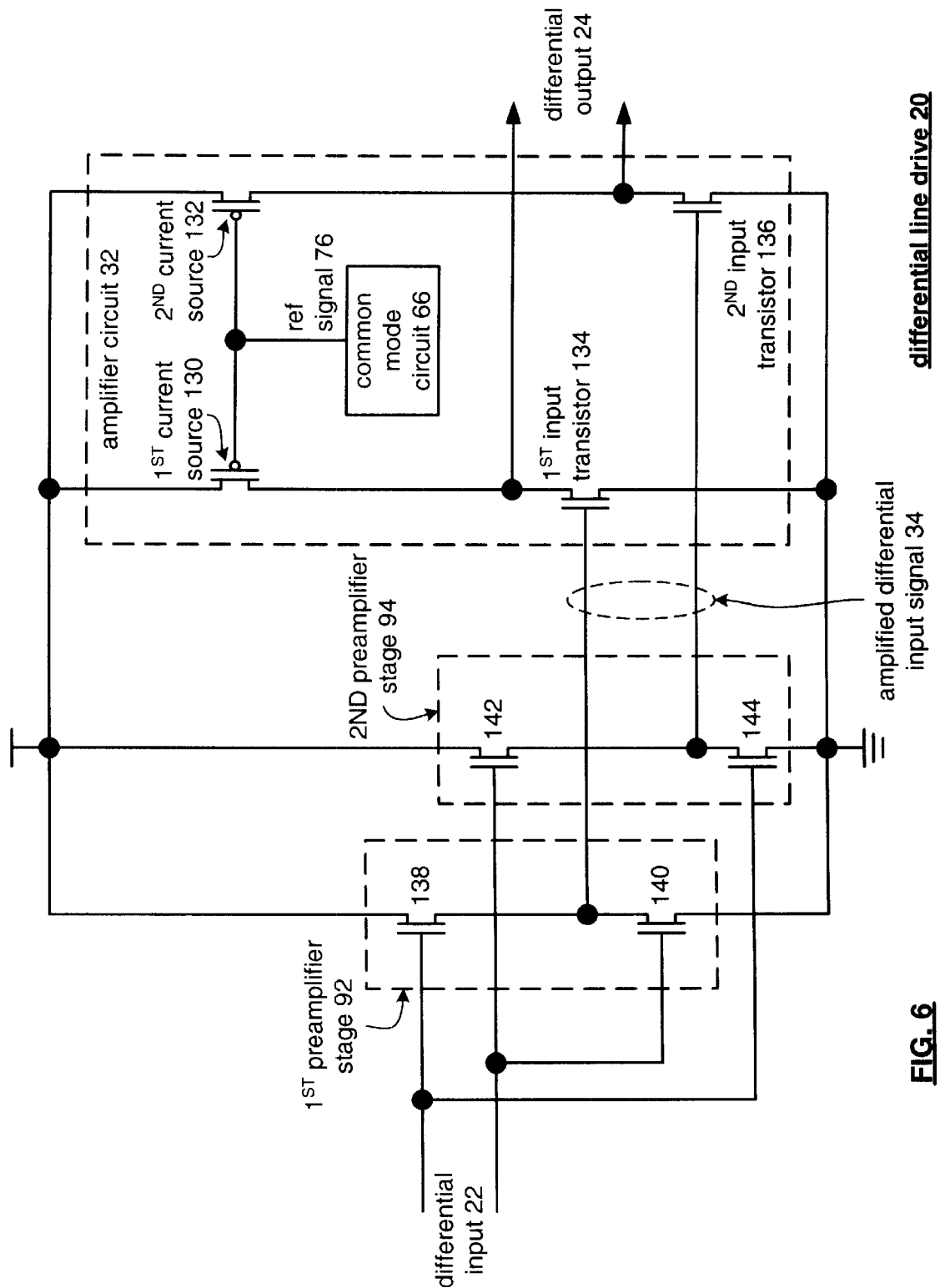
FIG. 6 illustrates a schematic block diagram of yet another alternate differential line driver in accordance with the present invention.

FIG. 6 illustrates a schematic block diagram of a further embodiment of the differential line driver 20. In this embodiment, the $1^{st}$ pre-amplifier stage 92 and the $2^{nd}$ pre-amplifier stage 94 are operably coupled to the amplifier circuit 32. In this embodiment, with respect to previous embodiments, P-channel transistors have replaced N-channel transistors and N-channel transistors have replaced P-channel transistors. As such, the $1^{st}$ pre-amplifier stage 92 includes N-channel transistors 138 and 140. N-channel transistor 140 acts as a current source for input transistor 138. The source of transistor 138 provides one leg of the amplified differential input signal 34 to the $1^{st}$ input transistor 134 of amplifier circuit 32. Similarly, the $2^{nd}$ pre-amplifier stage 94 includes N-channel transistors 142 and 144. N-channel transistor 144 provides a current source to the input transistor 142. The source of transistor 142 provides a $2^{nd}$ leg of the amplified differential input signal 34 to the 2hu nd input transistor 136. Based on the transconductance properties of transistors 138, 140, 142, and 144 the amplified differential input signal 34 will be a gained representation of the differential input 22.

The amplifier circuit 32 includes a $1^{st}$ current source 130, a $2^{nd}$ current source 132, the common mode circuit 66, the $1^{st}$ input transistor 134 and the $2^{nd}$ input transistor 136. The $1^{st}$ and $2^{nd}$ current sources 130 and 132 may be implemented utilizing P-channel transistors. The differential output 24 is produced via the nodes coupling the $1^{st}$ input transistor 134 to the $1^{st}$ current source 130 and the node coupling the $2^{nd}$ input transistor 136 to the $2^{nd}$ current source 132.

The preceding discussion has presented a line driver circuit that is capable of operating from a low supply voltage (e.g., down to 1.6 volts), provides a high output swing (e.g., up to 2 volts peak-to-peak), has an adjustable output impedance to match the line impedance, and has high linearity for driving high-speed data (e.g., in excess of 200 megabits per second) on to transmission lines. By cross-coupling transistors within a pre-amplifier circuit, the pre-amplifier provides gain without additional gain circuitry of conventional line drivers. As one of average skill in the art will appreciate, other embodiments may be derived from the teaching of the present invention without deviating from the scope of the claims.

What is claimed is:

1. A differential voltage preamplifier circuit comprising:
   a first preamplifier stage operably coupled to receive a first leg of a differential voltage input signal as an input and to receive a second leg of the differential voltage input as a first control signal, wherein the first preamplifier stage produces a first leg of an amplified differential voltage input from the first leg of the differential voltage input based on the first control signal;
   a second preamplifier stage operably coupled to receive the second leg of the differential voltage input signal as an input and to receive the first leg of the differential voltage input as a second control signal, wherein the second preamplifier stage produces a second leg of the amplified differential voltage input from the second leg of the differential voltage input based on the second control signal; and
   a level shifting circuit operably coupled to receive an input signal and to produce therefrom the differential voltage input signal.

2. The differential voltage preamplifier circuit of claim 1, wherein the level shifting circuit further comprises:
   a first level shifting stage operably coupled to receive a first leg of the input signal and to produce therefrom the first leg of the differential voltage input signal;
   a second level shifting stage operably coupled to receive a second leg of the input signal and to produce therefrom the second leg of the differential voltage input signal; and
   a biasing circuit operably coupled to provide a biasing current to the first and second level shifting stages.

3. The differential voltage preamplifier circuit of claim 2, wherein the first level shifting stage further comprises:
   an input N-channel transistor having a gate, a drain, and a source, wherein the gate of the input N-channel transistor is operably coupled to receive the first leg of the input signal, and wherein the source of the input N-channel transistor provides the first leg of the differential voltage input signal; and
   a current source operably coupled to provide a current to the input N-channel transistor, wherein the current source produces the current based on a reference current.

4. The differential voltage preamplifier circuit of claim 3, wherein the first preamplifier stage comprises:
   an input P-channel transistor having a gate, a drain, and a source, wherein the gate of the input P-channel transistor is operably coupled to receive the first leg of the differential voltage input signal; and a first controlled current source operably coupled to provide a first current to the input P-channel transistor, wherein the first controlled current source produces the first current based on the second leg of the differential voltage input signal.

5. The differential voltage preamplifier circuit of claim 2, wherein the second level shifting stage further comprises:

an input N-channel transistor having a gate, a drain, and a source, wherein the gate of the input N-channel transistor is operably coupled to receive the second leg of the input signal, and wherein the source of the input N-channel transistor provides the second leg of the differential voltage input signal; and a current source operably coupled to provide a current to the input N-channel transistor, wherein the current source produces the current based on a reference current.

6. The differential voltage preamplifier circuit of claim 5, wherein the second preamplifier stage comprises:

an input P-channel transistor having a gate, a drain, and a source, wherein the gate of the input P-channel transistor is operably coupled to receive the second leg of the differential voltage input signal; and a first controlled current source operably coupled to provide a first current to the input P-channel transistor, wherein the first controlled current source produces the first current based on the first leg of the differential voltage input signal.

7. The differential voltage preamplifier circuit of claim 1, wherein the first preamplifier stage comprises:

an input transistor having a gate, a drain, and a source, wherein the gate of the input transistor is operably coupled to receive the first leg of the differential voltage input signal; and a first controlled current source operably coupled to provide a first current to the input transistor, wherein the first controlled current source produces the first current based on the second leg of the differential voltage input signal.

8. The differential voltage preamplifier circuit of claim 1, wherein the second preamplifier stage comprises:

an input transistor having a gate, a drain, and a source, wherein the gate of the input transistor is operably coupled to receive the second leg of the differential voltage input signal; and a first controlled current source operably coupled to provide a first current to the input transistor, wherein the first controlled current source produces the first current based on the first leg of the differential voltage input signal.

* * * * *